(12) United States Patent
Huang (10) Patent No.: US 10,367,295 B2
(45) Date of Patent: Jul. 30, 2019

(54) CLAMPING MECHANISM FOR INDUSTRIAL INPUT/OUTPUT DEVICE

(71) Applicant: MOXA INC., New Taipei (TW)

(72) Inventor: Yi-Chun Huang, New Taipei (TW)

(73) Assignee: MOXA INC., New Taipei (TW)

( * ) Notice: Subject to any disclaimer, the term of this patent is extended or adjusted under 35 U.S.C. 154(b) by 225 days.

(21) Appl. No.: 15/647,244

(22) Filed: Jul. 11, 2017

(65) Prior Publication Data

US 2019/0020148 A1    Jan. 17, 2019

(51) Int. Cl.
*H05K 7/00* (2006.01)
*H05K 7/14* (2006.01)
*H01R 13/00* (2006.01)
*H01R 13/62* (2006.01)
*H01R 13/629* (2006.01)
*H01R 13/635* (2006.01)

(52) U.S. Cl.
CPC ........... *H01R 13/62* (2013.01); *H01R 13/629* (2013.01); *H01R 13/635* (2013.01); *H05K 7/14* (2013.01); *H05K 7/1474* (2013.01); *H01R 13/00* (2013.01); *H05K 7/00* (2013.01)

(58) Field of Classification Search
CPC .... H01R 13/518; H01R 13/62; H01R 13/629; H01R 13/635; H01R 13/00; H05K 7/14; H05K 7/1474; H05K 7/00
USPC .......................... 439/532, 716; 361/735, 810
See application file for complete search history.

(56) References Cited

U.S. PATENT DOCUMENTS

| | | | | |
|---|---|---|---|---|
| 4,171,861 | A * | 10/1979 | Hohorst | H01R 4/4845 439/49 |
| 5,249,979 | A * | 10/1993 | Deinhardt | H05K 7/1465 361/729 |
| 5,480,310 | A * | 1/1996 | Baum | H01R 9/2691 439/716 |
| 5,602,363 | A * | 2/1997 | Von Arx | H02B 1/052 174/559 |
| 5,775,955 | A * | 7/1998 | Graube | H01R 9/2408 439/716 |
| 5,803,772 | A * | 9/1998 | Muller | H01R 9/2608 439/716 |
| 5,907,476 | A * | 5/1999 | Davidsz | H02B 1/052 361/729 |
| 6,172,875 | B1 * | 1/2001 | Suzuki | G06F 1/183 361/679.4 |
| 6,371,435 | B1 * | 4/2002 | Landis | H02B 1/052 248/694 |
| 6,431,909 | B1 * | 8/2002 | Nolden | H01R 9/2608 361/735 |
| 7,516,927 | B2 * | 4/2009 | Portal | H01R 9/2608 248/221.11 |
| 9,039,460 | B2 * | 5/2015 | Hackemack | H01R 9/16 439/716 |

(Continued)

*Primary Examiner* — Gary F Paumen
(74) *Attorney, Agent, or Firm* — Chih Feng Yeh; Huntington IP Consulting Co., Ltd.

(57) ABSTRACT

The present disclosure illustrates a clamping mechanism for an industrial input/output device. In the clamping mechanism, an operating link can be slid and rotated to drive links of mechanism elements. Therefore, the efficiency of clamping the industrial input/output device on a DIN rail or unloading the industrial input/output device from the DIN rail fast and conveniently may be achieved.

9 Claims, 10 Drawing Sheets

(56) References Cited

U.S. PATENT DOCUMENTS

2006/0175489 A1* 8/2006 Portal .................. H01R 9/2608
                                                            248/215
2014/0148035 A1* 5/2014 Hackemack ............. H01R 9/16
                                                            439/345

* cited by examiner

CLAMPING MECHANISM FOR INDUSTRIAL INPUT/OUTPUT DEVICE

BACKGROUND

1. Technical Field

The present disclosure relates to a clamping mechanism, more particularly to a clamping mechanism which is able to clamp an industrial input/output device on a DIN rail or unloading the industrial input/output device from the DIN rail by simultaneous actions between mechanism elements.

2. Description of the Related Arts

German standardization institute defines a standard stamped metal rail which is called a DIN rail, and the DIN rail is generally used to secure an industrial input/output device.

In order to secure the industrial input/output device on the DIN rail, a clamping mechanism must be used to clamp the industrial input/output device. There are different available clamping mechanisms in market.

For example, U.S. issued patent, U.S. Pat. No. 6,431,909, discloses a detachable securement apparatus for a mounting rail. The mounting rail has first and second mounting flanges extending lengthwise along opposite sides of a support section. The apparatus has a body, a securement assembly and a release assembly. Extending from the body, the securement assembly has first and second interface members each including a contact region configured to exert a holding force on the first and second mounting flanges, respectively. The release assembly is configured for removing the holding force on both the first and second mounting flanges to allow vertical removal of the body. The release assembly has an engagement member coupled to the body and to the first and second interface members, and is engagable on a side of the body.

However, according to the technology disclosed by U.S. issued U.S. Pat. No. 6,431,909, external tools are required to secure the industrial input/output device on the DIN rail; generally, the DIN rail may have insufficient space for securing the industrial input/output device, so the manner of using the external tools to secure the industrial input/output device on the DIN rail has a problem of inconvenient operation.

To summarize, the conventional technology has the problem that the industrial input/output device cannot be secured on the DIN rail conveniently. Therefore, what is need is to develop a clamping device to solve the problem.

SUMMARY

In order to solve conventional problem that it is not convenient to secure the industrial input/output device on the DIN rail, the present disclosure is to provide a clamping mechanism for the industrial input/output device.

According to a first embodiment mode, the present disclosure provides a clamping mechanism for an industrial input/output device, and the clamping mechanism includes a shell member, an operating link, a first clamping rod, an elastic element, a rotary rod and a second clamping rod.

The shell member includes a sliding track disposed at a top side thereof and a mechanism assembly receiving space formed at a rear side thereof, and the sliding track includes a first sliding track end and a second sliding track end. The operating link includes a pivot pin, a rod sliding slot, a first operating part and a second operating part, and is slidably and rotatably disposed on the sliding track through the pivot pin. The first operating part and the second operating part are exposed out of the shell member, and the rod sliding slot includes a first sliding slot end and a second sliding slot end. The first clamping rod is disposed in the mechanism assembly receiving space, and includes a first driving part, an elastic element mounting part, a first clamping part and a second driving part. The first driving part is disposed in the rod sliding slot and slidable relative to the rod sliding slot, and a part of the first clamping part is exposed out of the shell member. The elastic element is secured in the mechanism assembly receiving space by the elastic element mounting part. The rotary rod is pivotally disposed in the mechanism assembly receiving space, and comprising a first rotary driving part and a second rotary driving part, and the second driving part is assembled with the first rotary driving part. The second clamping rod is disposed in the mechanism assembly receiving space, and includes a third driving part and a second clamping part. The third driving part is assembled with the second rotary driving part, and a part of the second clamping part is exposed out of the shell member.

According to a second embodiment mode, the present disclosure provides a clamping mechanism for an industrial input/output device, and the clamping mechanism includes a shell member, a first operating link, a second operating link, a first clamping rod, an elastic element, a rotary rod and a second clamping rod. The shell member includes a sliding track disposed at a top side thereof, and a mechanism assembly receiving space formed at a rear side thereof. The first operating link is disposed in the sliding track and slidable relative to the sliding track, and includes a first operating part exposed out of the shell member. The second operating link includes a second operating part exposed out of the shell member, and the second operating link pivotally disposed with the top side of the shell member. The first clamping rod is disposed in the mechanism assembly receiving space, and includes a first driving part, an elastic element mounting part, a first clamping part and a second driving part. The first driving part is pivotally connected to the second operating link. The first driving part is rotatable relative to the second operating link, and a part of the first clamping part is exposed out of the shell member. The elastic element is secured in the mechanism assembly receiving space by the elastic element mounting part. The rotary rod pivotally is disposed in the mechanism assembly receiving space, and includes a first rotary driving part and a second rotary driving part. The second driving part is assembled with the first rotary driving part. The second clamping rod is disposed in the mechanism assembly receiving space, and includes a third driving part and a second clamping part. The third driving part is assembled with the second rotary driving part, and a part of the second clamping part is exposed out of the shell member.

According to description above, the difference between the present disclosure and the conventional technology is that the operating link of the clamping mechanism of the present disclosure can be slid and rotated to drive links of the mechanism elements disposed inside the shell member to act simultaneously, thereby clamping the industrial input/output device on the DIN rail or unloading the industrial input/output device from the DIN rail conveniently and fast.

Therefore, the technical means of the present disclosure can achieve the technical effect of clamping the industrial input/output device on the DIN rail or unloading the industrial input/output device from the DIN rail fast and conveniently.

BRIEF DESCRIPTION OF THE DRAWINGS

The structure, operating principle and effects of the present disclosure will be described in detail by way of various embodiments which are illustrated in the accompanying drawings.

DETAILED DESCRIPTION

The following embodiments of the present invention are herein described in detail with reference to the accompanying drawings. These drawings show specific examples of the embodiments of the present invention. It is to be understood that these embodiments are exemplary implementations and are not to be construed as limiting the scope of the present invention in any way. Further modifications to the disclosed embodiments, as well as other embodiments, are also included within the scope of the appended claims. These embodiments are provided so that this disclosure is thorough and complete, and fully conveys the inventive concept to those skilled in the art. Regarding the drawings, the relative proportions and ratios of elements in the drawings may be exaggerated or diminished in size for the sake of clarity and convenience. Such arbitrary proportions are only illustrative and not limiting in any way. The same reference numbers are used in the drawings and description to refer to the same or like parts.

It is to be understood that, although the terms 'first', 'second', 'third', and so on, may be used herein to describe various elements, these elements should not be limited by these terms. These terms are used only for the purpose of distinguishing one component from another component. Thus, a first element discussed herein could be termed a second element without altering the description of the present invention. As used herein, the term "or" includes any and all combinations of one or more of the associated listed items.

Figure 1:
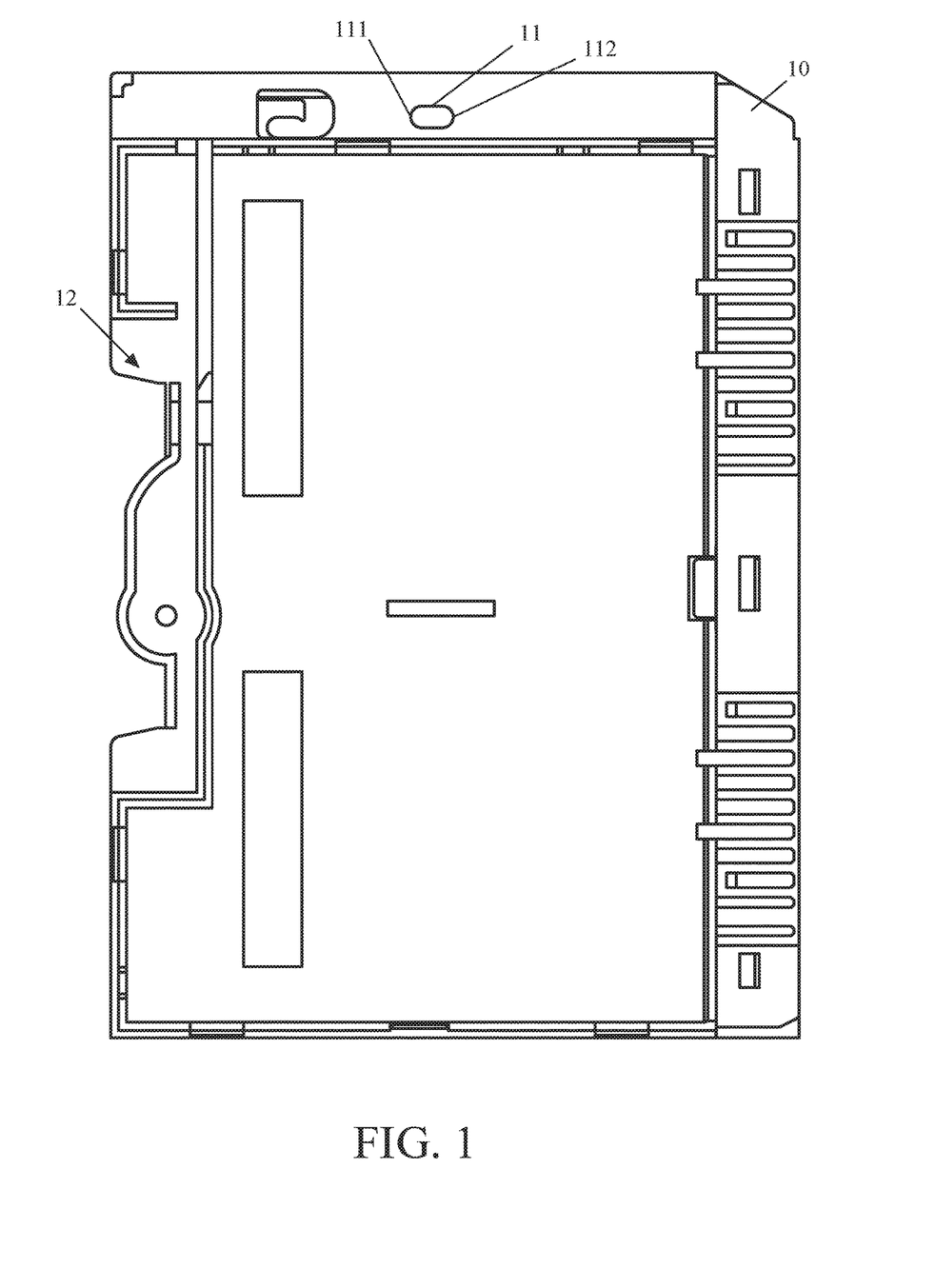
FIG. 1 is a plan view of the interior of a shell member of a clamping mechanism for an industrial input/output device, in accordance with a first embodiment mode of the present disclosure.

Please refer to FIG. 1, which is a plan view of the interior of a shell member of a clamping mechanism for an industrial input/output device, in accordance with a first embodiment mode of the present disclosure.

The shell member 10 includes a sliding track 11 disposed at a top side thereof and a mechanism assembly receiving space formed at a rear side thereof. The sliding track 11 includes a first sliding track end 111 and a second sliding track end 112.

Figure 2:
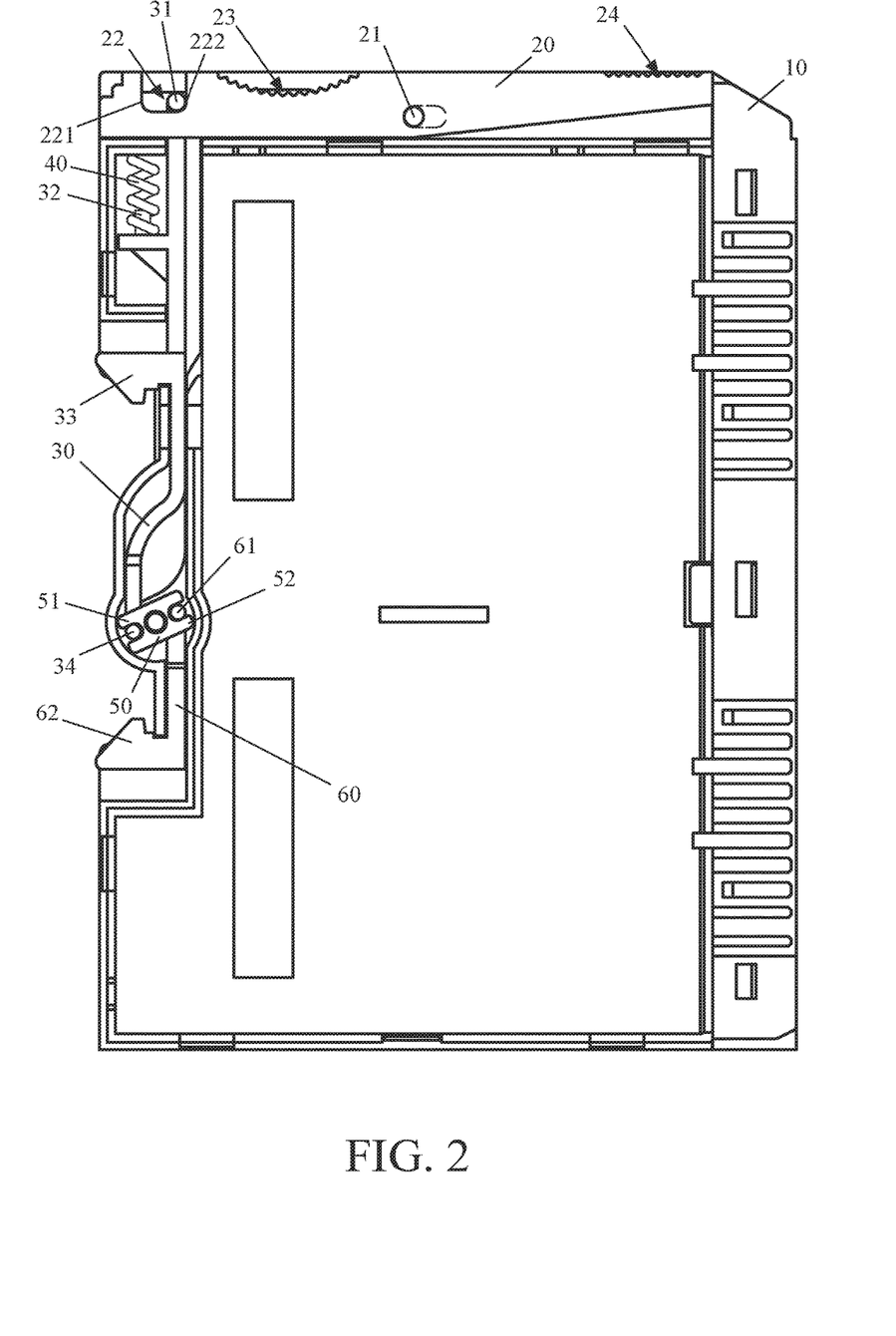
FIG. 2 is a plan view of a mechanism assembly of the clamping mechanism for the industrial input/output device, in accordance with the first embodiment mode of the present disclosure.

Please refer to FIG. 2, which is a plan view of a mechanism assembly of the clamping mechanism for the industrial input/output device, in accordance with the first embodiment mode of the present disclosure.

As shown in FIG. 2, an operating link 20 includes a pivot pin 21, a rod sliding slot 22, a first operating part 23 and a second operating part 24. The operating link 20 is disposed in the sliding track 11 of the shell member 10 by the pivot pin 21, and is slidable and rotatable relative to the sliding track 11 of the shell member 10. The first operating part 23 and the second operating part 24 are exposed out of the shell member 10. The rod sliding slot 22 includes a first sliding slot end 221 and a second sliding slot end 222.

It should be noted that the first operating part 23 of the operating link 20 has a surface in a wave shape to increase friction thereof, so that the first operating part 23 of the operating link 20 may be operated more easily.

A first clamping rod 30 is disposed in the mechanism assembly receiving space 12 of the shell member 10, and includes a first driving part 31, an elastic element mounting part 32, a first clamping part 33 and a second driving part 34. The first driving part 31 of the first clamping rod 30 is disposed in the rod sliding slot 22 of the operating link 20, so that the first driving part 31 of the first clamping rod 30 is slidable relative to the rod sliding slot 22 of the operating link 20. A part of the first clamping part 33 of the first clamping rod 30 is exposed out of the shell member 10, and the exposed part of the first clamping part 33 is configured to clamp the industrial input/output device on the DIN rail.

The elastic element mounting part 32 of the first clamping rod 30 is configured to secure an elastic element 40 in the mechanism assembly receiving space 12 of the shell member 10, and the elastic element 40 is configured to provide a clamping force to enable the first clamping rod 30 to clamp the industrial input/output device on the DIN rail.

A rotary rod 50 is pivotally disposed in the mechanism assembly receiving space 12 of the shell member 10, and includes a first rotary driving part 51 and a second rotary driving part 52. The second driving part 34 of the first clamping rod 30 is assembled with the first rotary driving part 51 of the rotary rod 50, so that the rotary rod 50 may be driven to rotate by movement of the first clamping rod 30.

A second clamping rod 60 is disposed in the mechanism assembly receiving space 12 of the shell member 10, and includes a third driving part 61 and a second clamping part 62. The third driving part 61 of the second clamping rod 60 is assembled with the second rotary driving part 52 of the rotary rod 50, so that the second clamping rod 60 may be driven to move by rotation of the rotary rod 50. A part of the second clamping part 62 of the second clamping rod 60 is exposed out of the shell member 10, and the exposed part of the second clamping part 62 is used to clamp the industrial input/output device on the DIN rail.

Figure 3A:
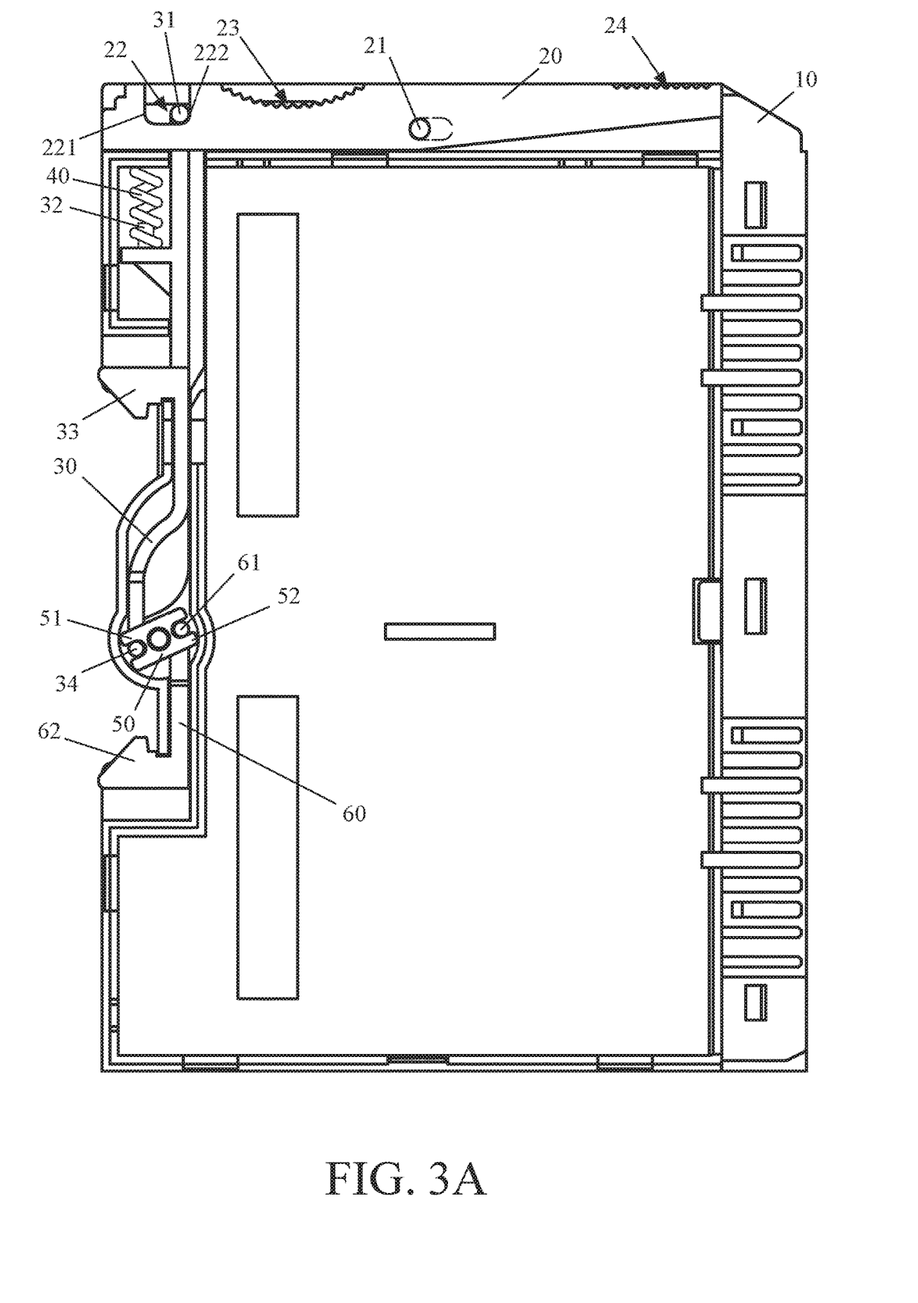
FIGS. 3A, 3B and 3C are plan views showing a process of operating the clamping mechanism for the industrial input/output device, in accordance with the first embodiment mode of the present disclosure.
Figure 3B:
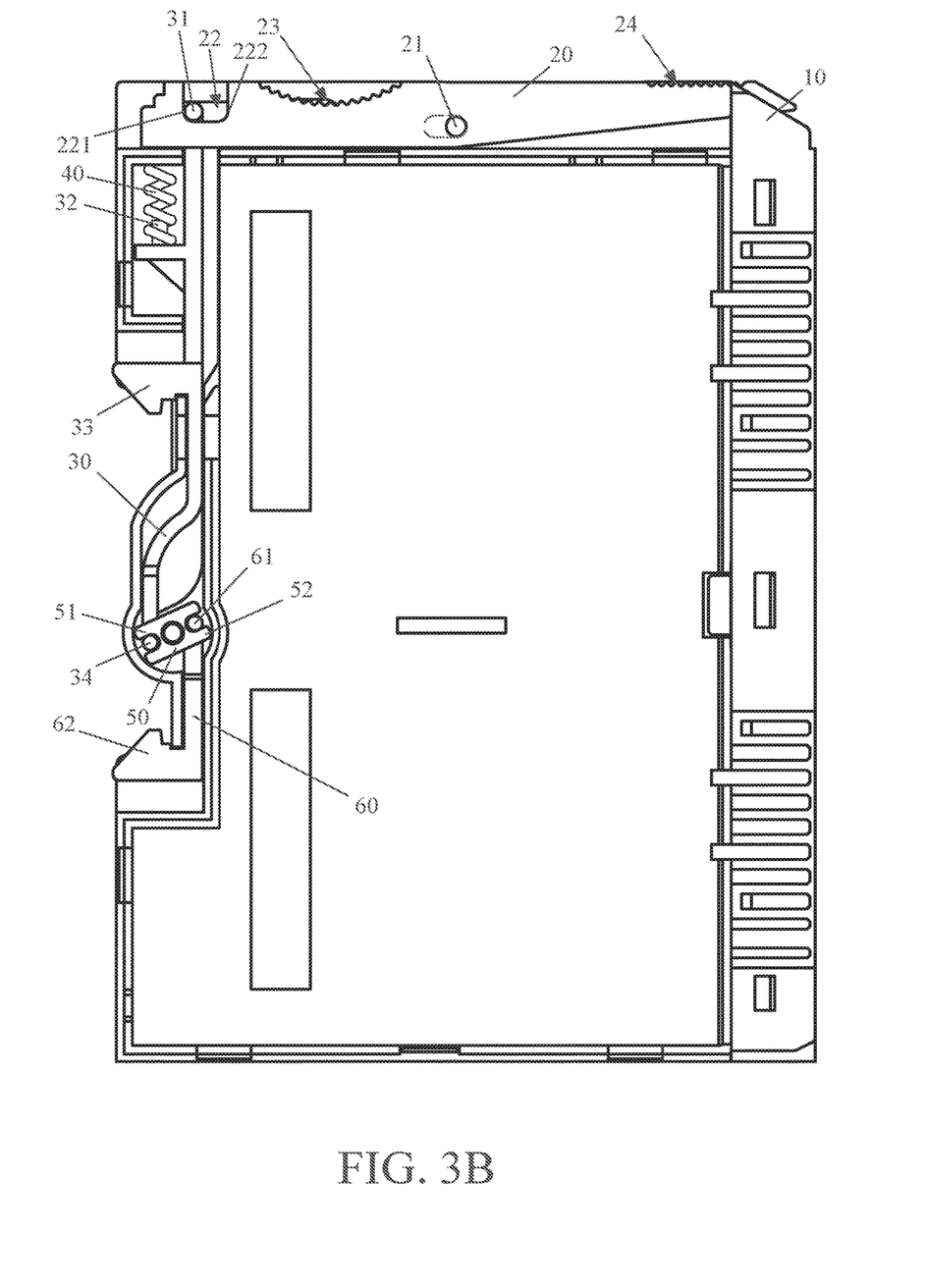
Figure 3C:
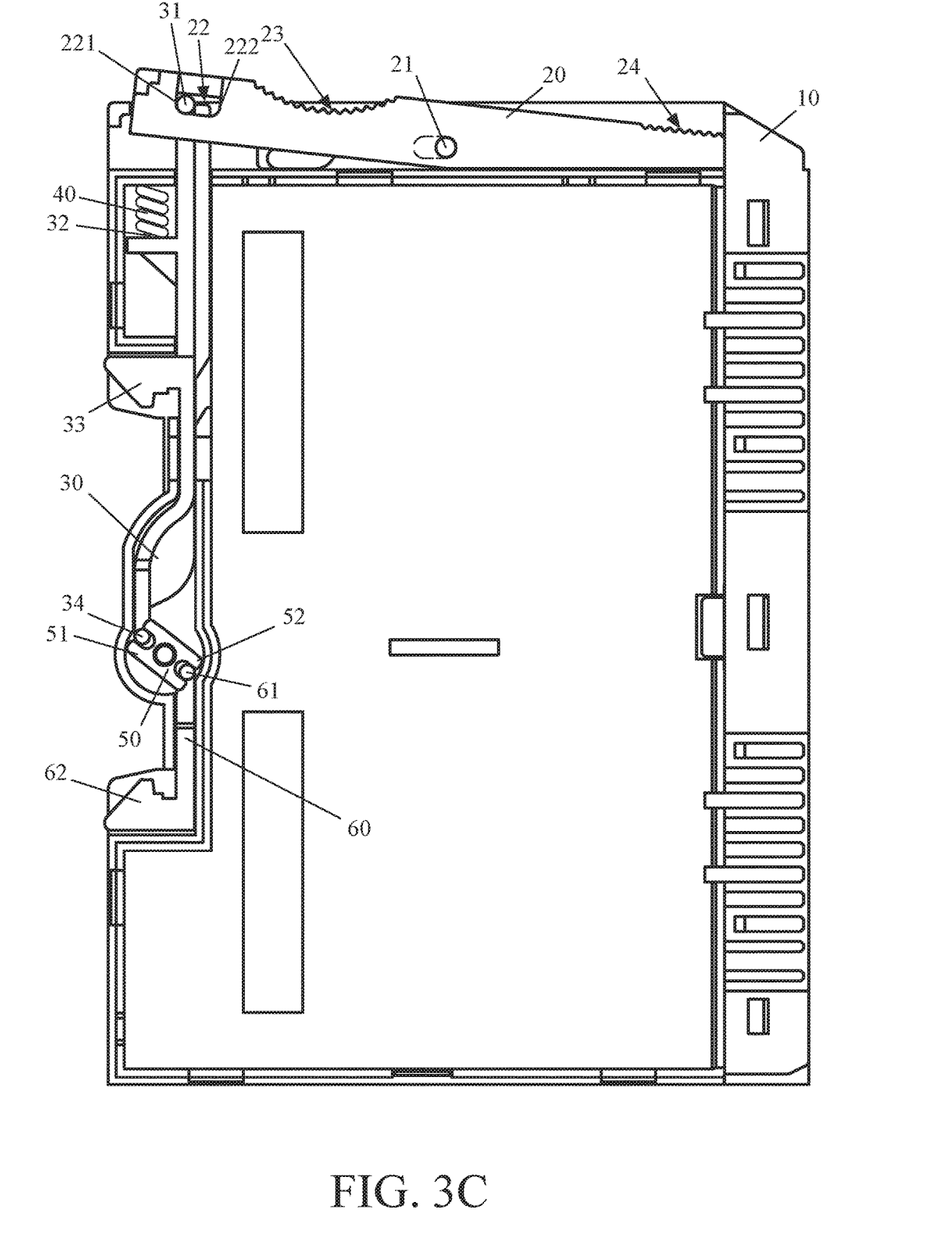

Please refer to FIGS. 3A through 3C, which are plan views showing a process of operating the clamping mechanism for the industrial input/output device, in accordance with the first embodiment mode of the present disclosure.

FIG. 3A shows a default state of the clamping mechanism for the industrial input/output device. In the default state, the pivot pin 21 of the operating link 20 is located at the first sliding track end 111 of the sliding track 11, and the first driving part 31 of the first clamping rod 30 is located at the second sliding slot end 222 of the rod sliding slot 22, and at this time, the operating link 20 is unable to rotate relative to the shell member 10, and the first clamping part 33 of the first clamping rod 30 is forced by the downward elastic force of the elastic element 40 to expose the part thereof out of the shell member 10, and the second clamping part 62 of the second clamping rod 60 acts simultaneously with the first clamping part 33 of the first clamping rod 30 to expose the part thereof out of the shell member 10, so that the downward elastic force of the elastic element 40 enables the first clamping part 33 of the first clamping rod 30 and the second clamping part 62 of the second clamping rod 60 to clamp the industrial input/output device on the DIN rail.

In order to clamp the industrial input/output device on the DIN rail or unload the industrial input/output device from the DIN rail, the first operating part 23 of the operating link 20 can be operated to push or pull the operating link 20 out of the shell member 10, as shown in FIG. 3B; and at this time, the pivot pin 21 of the operating link 20 is also moved to the second sliding track end 112 of the sliding track 11 and the first driving part 31 of the first clamping rod 30 is moved to the first sliding slot end 221 of the rod sliding slot 22, thereby making the operating link 20 rotatable relative to the shell member 10.

Next, as shown in FIG. 3C, the second operating part 24 of the operating link 20 can be pressed down to rotate the operating link 20 clockwise relative to the shell member 10, so that the first clamping rod 30 is driven by the first driving part 31 of the first clamping rod 30 to move upwardly and the first clamping part 33 of the first clamping rod 30 is also upwardly moved into the shell member 10. By upwardly moving the second driving part 34 of the first clamping rod 30 to clockwise rotate the rotary rod 30, the second clamping rod 60 can be moved downwardly to drive the second clamping part 62 of the second clamping rod 60 to move into the shell member 10, so that the industrial input/output device can be clamped on the DIN rail or unloaded from the DIN rail.

After the second operating part 24 of the operating link 20 is stopped pressing down, the downward elastic force of the elastic element 40 can push the first clamping rod 30 to move downwardly, to expose the part of the first clamping part 33 of the first clamping rod 30 out of the shell member 10; next, the first driving part 31 of the first clamping rod 30 can be moved downwardly to drive the operating link 20 to counter-clockwise rotate, and the second driving part 34 of the first clamping rod 30 can be moved downwardly to drive the rotary rod 30 to counter-clockwise rotate, so as to drive the second clamping rod 60 to move upwardly to expose the part of the second clamping part 62 out of the shell member 10. As a result, while be exerted by the downward elastic force of the elastic element 40, the first clamping part 33 of the first clamping rod 30 and the second clamping part 62 of the second clamping rod 60 can clamp the industrial input/output device on the DIN rail, as shown in FIG. 3B.

Next, the first operating part 23 of the operating link 20 is operated to push the operating link 20 into the shell member 10, and at this time, the pivot pin 21 of the operating link 20 is moved to the first sliding track end 111 of the sliding track 11, and the first driving part 31 of the first clamping rod 30 is moved to the second sliding slot end 222 of the rod sliding slot 22, so that the operating link 20 is unable to rotate relative to the shell member 10.

Preferably, the shell member 10, the operating link 20, the first clamping rod 30, the elastic element 40, the rotary rod 50 and the second clamping rod 60 are made of metal material or polymer material; for example, the metal material may be iron, steel or aluminum alloy, the polymer material may be polyethylene (PE), polyvinyl chloride (PVC) or polypropylene (PP), but the application field of the present disclosure is not limited to these examples merely for illustration.

The following illustrates the clamping mechanism for the industrial input/output device, in accordance with a second embodiment mode of the present disclosure.

Figure 4:
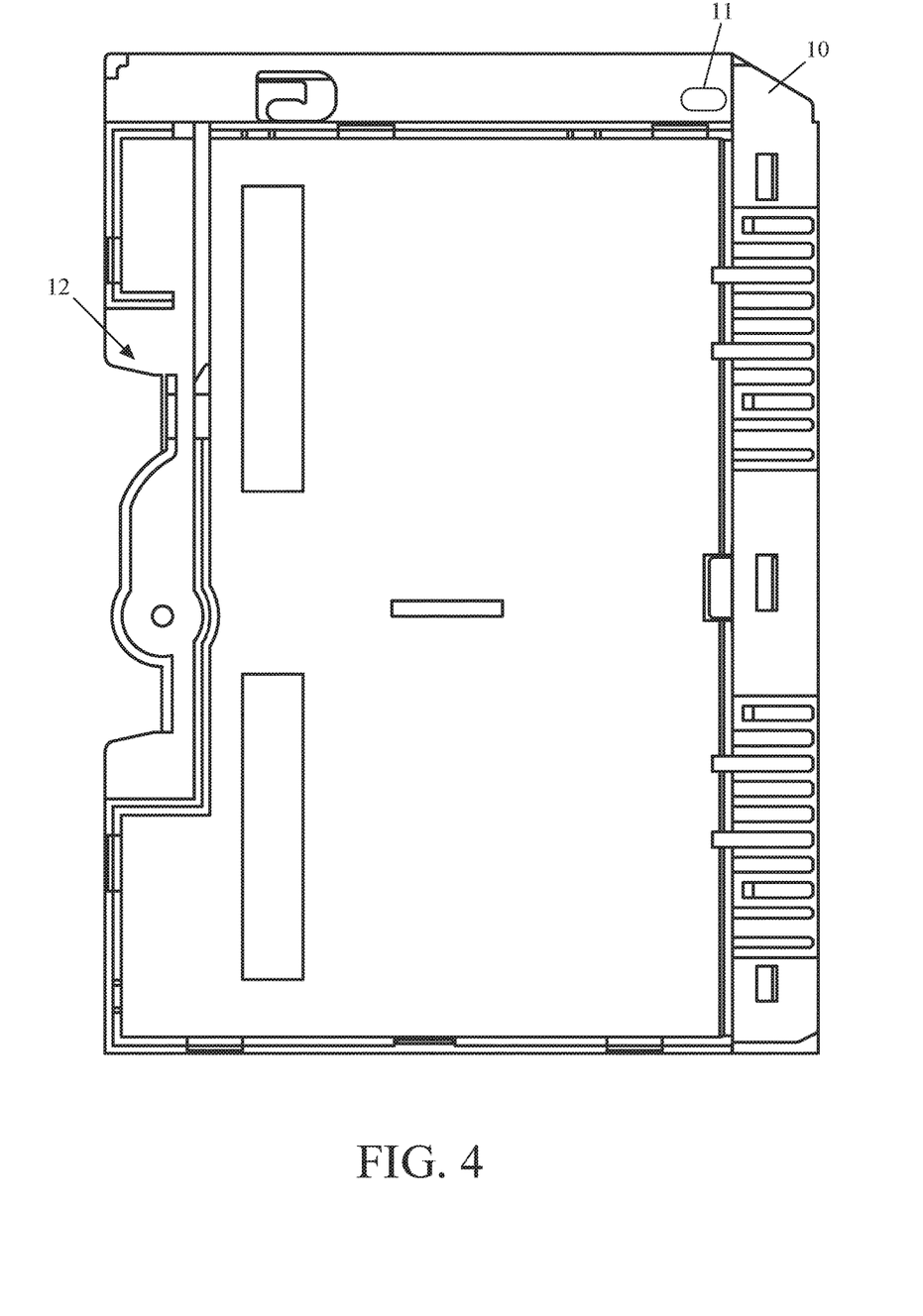
FIG. 4 is a plan view of the interior of a shell member of a clamping mechanism for an industrial input/output device, in accordance with a second embodiment mode of the present disclosure.

Please refer to FIG. 4, which is a plan view of the interior of a shell member of a clamping mechanism for an industrial input/output device, in accordance with a second embodiment mode of the present disclosure.

The shell member 10 includes a sliding track 11 disposed at a top side thereof and a mechanism assembly receiving space 12 at a rear side thereof.

Figure 5:
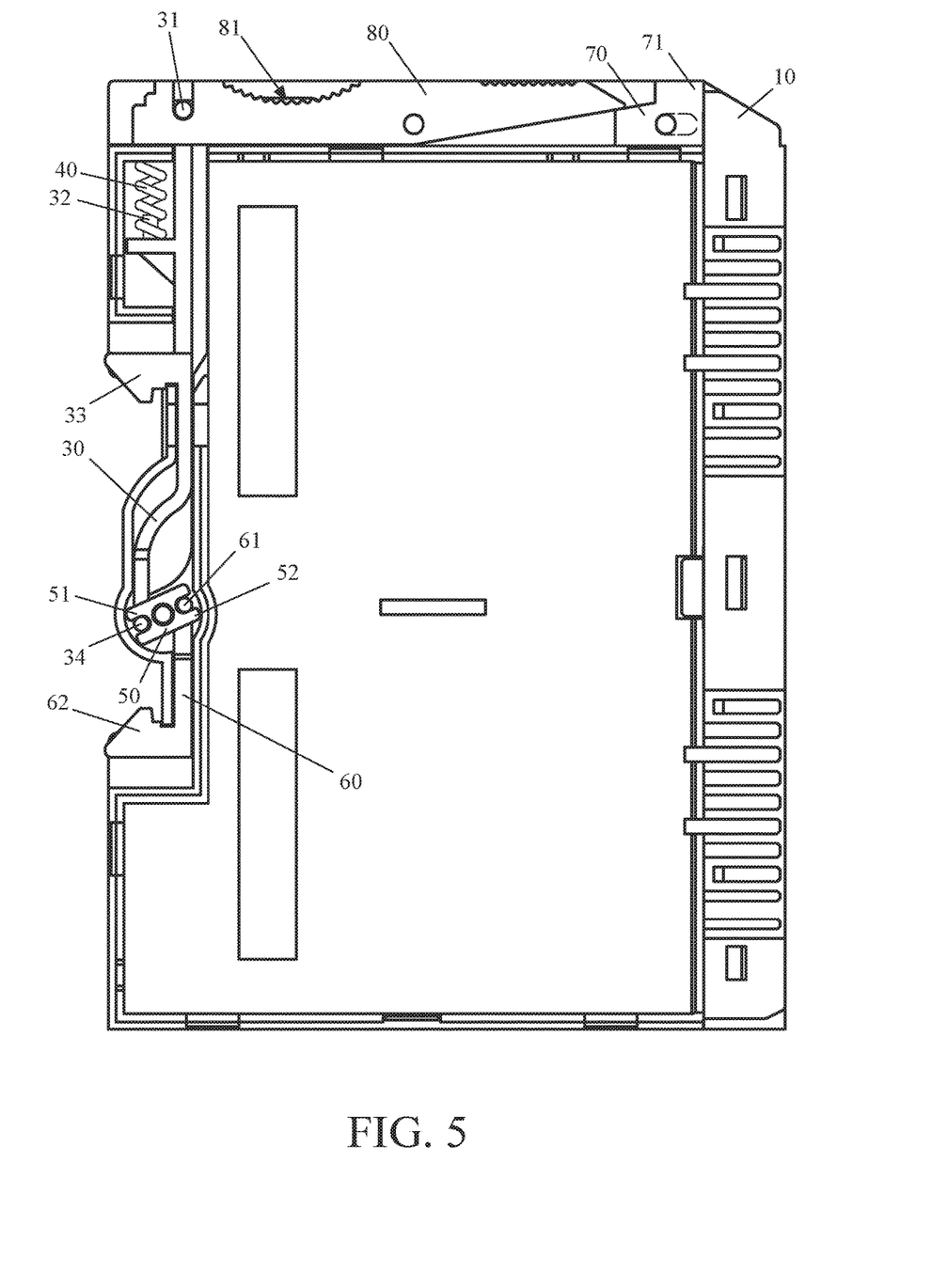
FIG. 5 is a plan view of a mechanism assembly of the clamping mechanism for the industrial input/output device, in accordance with the second embodiment mode of the present disclosure.

Please refer to FIG. 5, which is a plan view of a mechanism assembly of the clamping mechanism for the industrial input/output device, in accordance with the second embodiment mode of the present disclosure.

A first operating link 70 includes a first operating part 71 which is exposed out of the shell member 10 and disposed on the sliding track 11 of the shell member 10, so that the first operating link 70 is slidable along the sliding track 11 of the shell member 10.

A second operating link 80 includes a second operating part 81 which is exposed out of the shell member 10. The second operating link 80 is pivotally connected with the top side of the shell member 10. The first operating link 70 can be pushed or pulled out of the shell member 10 to release the constraint for rotation of the second operating link 80, that is, when the first operating link 70 is pushed out of the shell member 10, the second operating link 80 becomes rotatable relative to the shell member 10, and when the first operating link 70 is inserted into the shell member 10, the second operating link 80 becomes non-rotatable relative to the shell member 10.

The first clamping rod 30 is disposed in the mechanism assembly receiving space 12 of the shell member 10, and the first clamping rod 30 includes a first driving part 31, an elastic element mounting part 32, a first clamping part 33 and a second driving part 34. The first driving part 31 of the first clamping rod 30 is pivotally connected to the operating link 20, so that the first driving part 31 of the first clamping rod 30 can be driven to move by the operating link 20. A part of the first clamping part 33 of the first clamping rod 30 is exposed out of the shell member 10, and the exposed part of the first clamping part 33 of the first clamping rod 30 is used to clamp the industrial input/output device on the DIN rail.

An elastic element 40 is secured in the mechanism assembly receiving space 12 of the shell member 10 by the elastic element mounting part 32 of the first clamping rod 30, and configured to provide a clamping force to enable the first clamping rod 30 to clamp the industrial input/output device on the DIN rail.

The rotary rod 50 is pivotally disposed in the mechanism assembly receiving space 12 of the shell member 10, and includes a first rotary driving part 51 and a second rotary driving part 52. The second driving part 34 of the first clamping rod 30 is assembled with the first rotary driving part 51 of the rotary rod 50, so that the rotary rod 50 can be driven to rotate by the movement of the first clamping rod 30.

The second clamping rod 60 is disposed in the mechanism assembly receiving space 12 of the shell member 10, and includes a third driving part 61 and a second clamping part 62. The third driving part 61 of the second clamping rod 60 is assembled with the second rotary driving part 52 of the rotary rod 50, so that the second clamping rod 60 can be driven to move by rotation of the rotary rod 50. A part of the second clamping part 62 of the second clamping rod 60 is exposed out of the shell member 10, and the exposed part of the second clamping part 62 is used to clamp the industrial input/output device on the DIN rail.

Figure 6A:
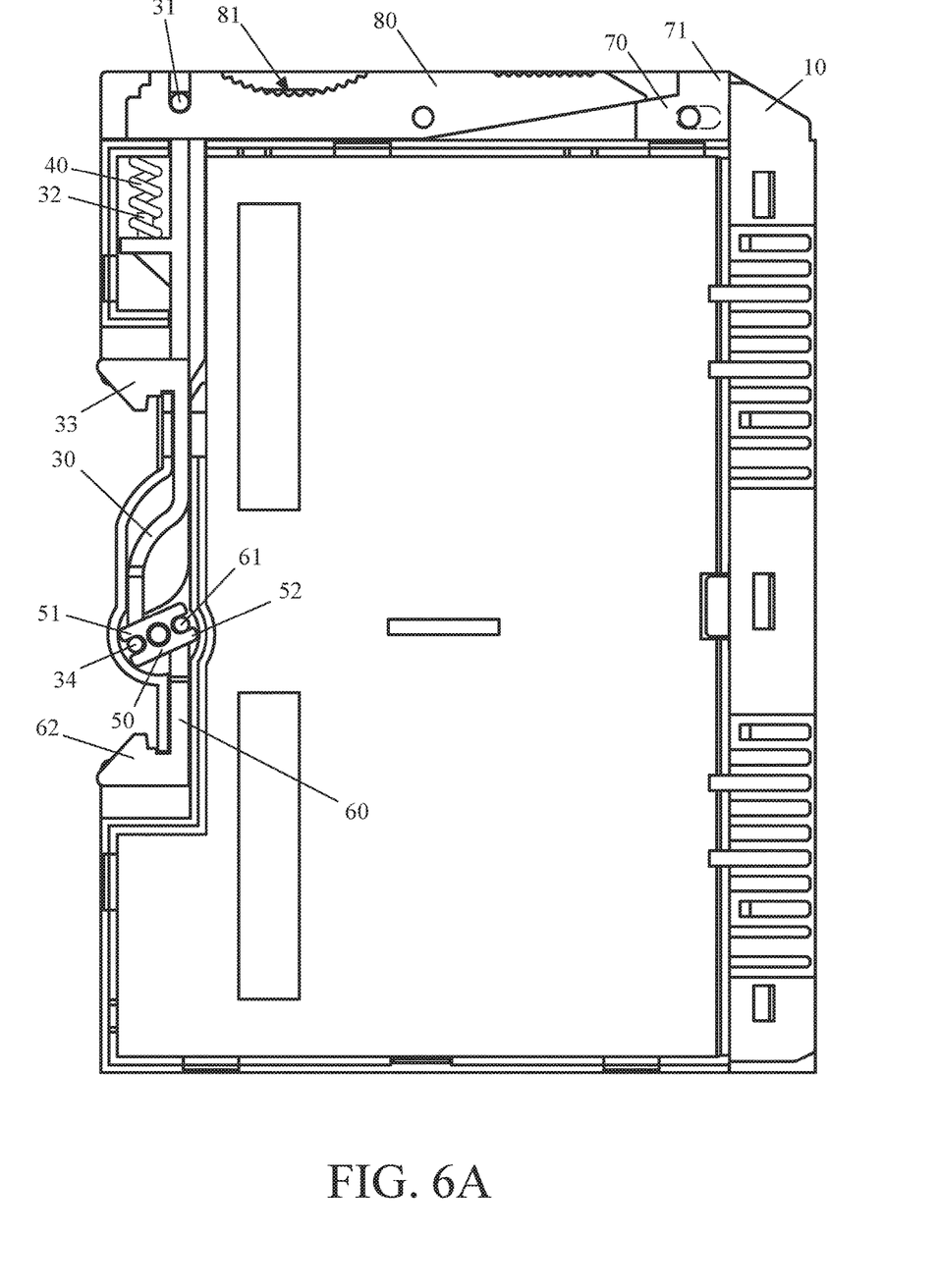
FIGS. 6A-6C are plan views showing a process of operating the clamping mechanism for the industrial input/output device, in accordance with the second embodiment mode of the present disclosure.
Figure 6B:
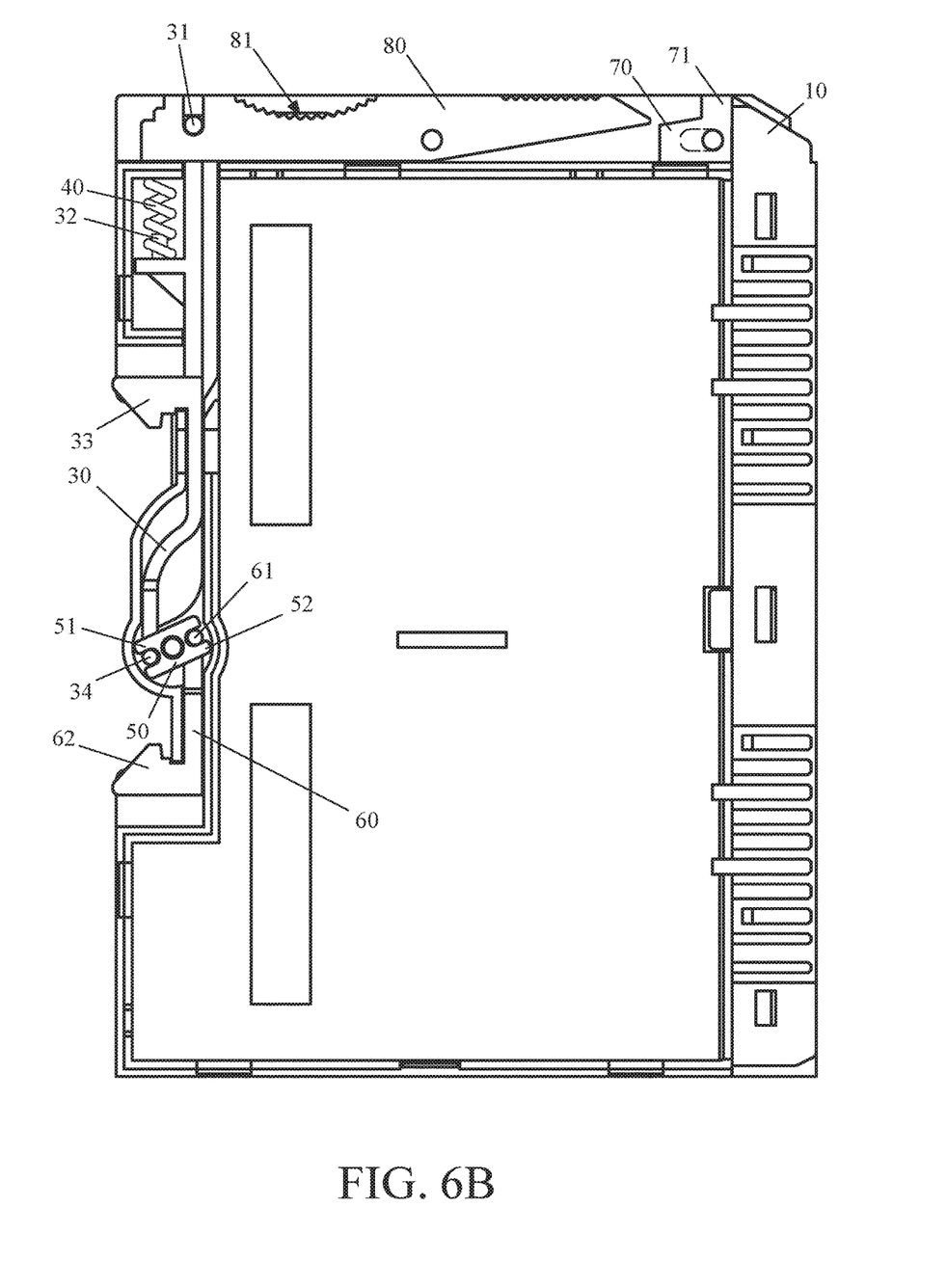
Figure 6C:
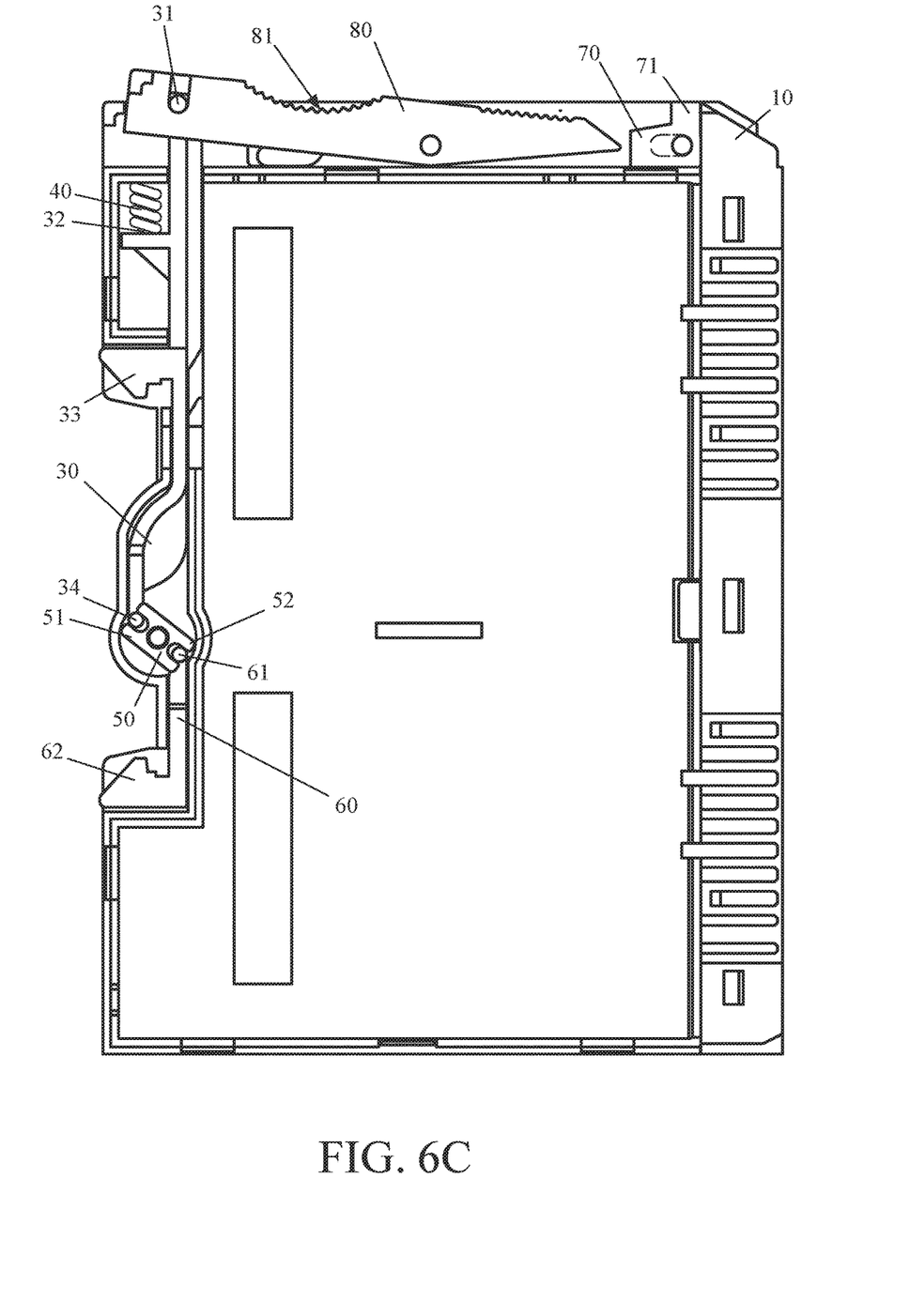

Please refer to FIGS. 6A-6C, which are plan views showing a process of operating the clamping mechanism for the industrial input/output device, in accordance with the second embodiment mode of the present disclosure.

FIG. 6A shows a default state of the clamping mechanism for the industrial input/output device. In the default state, the first operating link 70 is inserted in the shell member 10, and the second operating link 80 is non-rotatable subject to constraint of the first operating link 70. The elastic element 40 exerts downward elastic force on the first clamping part 33 to expose the part of the first clamping part 33 of the first clamping rod 30 out of the shell member 10; at the same time, the part of the second clamping part 62 of the second clamping rod 60 is also exposed out of the shell member 10 because of linking relationship of entire mechanism. As a result, while being exerted by the downward elastic force of the elastic element 40, the first clamping part 33 of the first clamping rod 30 and the second clamping part 62 of the second clamping rod 60 can clamp the industrial input/output device on the DIN rail.

Please refer to FIG. 6B. In order to clamp the industrial input/output device on the DIN rail or unload the industrial input/output device from the DIN rail, the first operating part 71 of the first operating link 70 can be operated to push or pull the first operating link 70 out of the shell member 10, thereby releasing the constraint for rotation of the second operating link 80.

Please refer to FIG. 6C. When the second operating part 81 of the second operating link 80 is pressed down, the second operating link 80 is rotated clockwise relative to the shell member 10, and the first driving part 31 of the first clamping rod 30 drives the first clamping rod 30 to move upwardly, so that the first clamping part 33 of the first clamping rod 30 is moved into the shell member 10. By upwardly moving the second driving part 34 of the first clamping rod 30 to drive clockwise rotation of the rotary rod 30 to move the second clamping rod 60 downwardly, the second clamping part 62 of the second clamping rod 60 can be moved into the shell member 10, thereby clamping the industrial input/output device on the DIN rail or unloading the industrial input/output device from the DIN rail.

After the second operating part 81 of the second operating link 80 is stopped pressing down, the first clamping rod 30 is pushed to move downwardly by the downward elastic force of the elastic element 40, so as to expose the part of the first clamping part 33 of the first clamping rod 30 out of the shell member 10, and at this time, the second operating link 80 is counter-clockwise rotated by downward movement of the first driving part 31 of the first clamping rod 30. When the second driving part 34 of the first clamping rod 30 is moved downwardly to drive the rotary rod 30 to counter-clockwise rotate, the second clamping rod 60 can be driven to move upwardly to expose the part of the second clamping part 62 out of the shell member 10. Subject to the downward elastic force of the elastic element 40, the first clamping part 33 of the first clamping rod 30 and the second clamping part 62 of the second clamping rod 60 can clamp the industrial input/output device on the DIN rail, as shown in FIG. 6B.

Next, the first operating part 71 of the first operating link 70 can be operated to insert the first operating link 70 into the shell member 10, so that the first operating link 70 can limit rotation of the second operating link 80, that is, the second operating link 80 is unable to rotate relative to the shell member 10.

Preferably, the shell member 10, the first operating link 70, the second operating link 80, the first clamping rod 30, the elastic element 40, the rotary rod 50 and the second clamping rod 60 are made of metal material or polymer material, and for example, the metal material may be iron, steel, or aluminum alloy; the polymer material may be polyethylene, polyvinyl chloride, or polypropylene, but the application field of the present disclosure is not limited to these examples which are merely for exemplary illustration.

To summarize, the difference between the present disclosure and the conventional technology is that the operating link of the clamping mechanism of the present disclosure can be slid and rotated to drive links of the mechanism gearings disposed inside the shell member to act simultaneously, thereby clamping the industrial input/output device on the DIN rail or unloading the industrial input/output device from the DIN rail conveniently and fast.

The technical means of the present disclosure can solve the conventional technology problem that it is inconvenient to secure the industrial input/output device on the DIN rail, and further achieve the technical effect of clamping the industrial input/output device on the DIN rail or unloading the industrial input/output device from the DIN rail fast and conveniently.

The present disclosure disclosed herein has been described by means of specific embodiments. However, numerous modifications, variations and enhancements can be made thereto by those skilled in the art without departing from the spirit and scope of the invention set forth in the claims.

What is claimed is:

1. A clamping mechanism for an industrial input/output device, comprising:
    a shell member, comprising a sliding track disposed at a top side thereof and a mechanism assembly receiving space formed at a rear side thereof, and the sliding track comprising a first sliding track end and a second sliding track end;
    an operating link comprising a pivot pin, a rod sliding slot, a first operating part and a second operating part, and slidably and rotatably disposed on the sliding track through the pivot pin, wherein the first operating part and the second operating part are exposed out of the shell member, and the rod sliding slot comprises a first sliding slot end and a second sliding slot end;
    a first clamping rod disposed in the mechanism assembly receiving space, and comprising a first driving part, an elastic element mounting part, a first clamping part and a second driving part, and wherein the first driving part is disposed in the rod sliding slot and slidable relative to the rod sliding slot, and a part of the first clamping part is exposed out of the shell member;
    an elastic element secured in the mechanism assembly receiving space through the elastic element mounting part;
    a rotary rod pivotally disposed in the mechanism assembly receiving space, and comprising a first rotary driving part and a second rotary driving part, wherein the second driving part is assembled with the first rotary driving part; and
    a second clamping rod disposed in the mechanism assembly receiving space, and comprising a third driving part and a second clamping part, wherein the third driving part is assembled with the second rotary driving part, and a part of the second clamping part is exposed out of the shell member.

2. The clamping mechanism according to claim 1, wherein a surface of the first operating part is in a wave shape.

3. The clamping mechanism according to claim 1, wherein the first operating part is operated to slide the pivot pin to the second sliding track end and slide the first driving part to the first sliding slot end, and after the second operating part is pressed down, the operating link is rotated relative to the shell member to move the first clamping rod, thereby moving the first clamping part into the shell member, and the second driving part drives the rotary rod to rotate to move the second clamping rod, thereby moving the second clamping part into the shell member, so as to secure the industrial input/output device on a DIN rail or unload the industrial input/output device from the DIN rail.

4. The clamping mechanism according to claim 1, wherein when the second operating part is stopped pressing down, the first clamping rod is pushed by elastic force of the elastic element, so that the part of the first clamping part is exposed out of the shell member and the operating link is reversely rotated relative to the shell member, and the second driving part drives the rotary rod to reversely rotate, the second clamping rod is moved to expose the part of the second clamping part out of the shell member, so that the industrial input/output device is clamped on the DIN rail, wherein the first operating part is operated to slide the pivot pin to the first sliding track end and slide the first driving part to the second sliding slot end, so that the operating link is unable to rotate relative to the shell member.

5. The clamping mechanism according to claim 1, wherein the shell member, the operating link, the first clamping rod, the elastic element, the rotary rod and the second clamping rod are made of metal material or polymer material.

6. A clamping mechanism for an industrial input/output device, comprising:
a shell member comprising a sliding track disposed at a top side thereof, and a mechanism assembly receiving space formed at a rear side thereof;
a first operating link comprising a first operating part exposed out of the shell member, and disposed in the sliding track and slidable relative to the sliding track;
a second operating link comprising a second operating part exposed out of the shell member, and the second operating link pivotally connected with the top side of the shell member;
a first clamping rod disposed in the mechanism assembly receiving space, and comprising a first driving part, an elastic element mounting part, a first clamping part and a second driving part, and the first driving part pivotally connected to the second operating link, wherein the first driving part is rotatable relative to the second operating link, and a part of the first clamping part is exposed out of the shell member;
an elastic element secured in the mechanism assembly receiving space by the elastic element mounting part;
a rotary rod pivotally disposed in the mechanism assembly receiving space, and comprising a first rotary driving part and a second rotary driving part, wherein the second driving part is assembled with the first rotary driving part; and
a second clamping rod disposed in the mechanism assembly receiving space, and comprising a third driving part and a second clamping part, wherein the third driving part is assembled with the second rotary driving part, and a part of the second clamping part is exposed out of the shell member.

7. The clamping mechanism according to claim 6, wherein the first operating part is operated to slide the first operating link out of the shell member, so as to release constraint for rotation of the second operating link, and when the second operating part is pressed down to rotate the second operating link relative to the shell member, the first clamping rod is driven to move the first clamping part into the shell member, and the rotary rod is driven to rotate by the second driving part, thereby driving the second clamping rod to move the second clamping part into the shell member, so that the industrial input/output device is secured on a DIN rail or unloaded from the DIN rail.

8. The clamping mechanism according to claim 6, wherein when the second operating part is stopped pressing down, the first clamping rod is pushed by elastic force of the elastic element to expose the part of the first clamping part out of the shell member and reversely rotate the second operating link relative to the shell member, and the second driving part drives the rotary rod to reversely rotate to move the second clamping rod, thereby exposing the part of the second clamping part out of the shell member, so that the industrial input/output device is clamped on the DIN rail, and the first operating part is then operated to slide the first operating link into the shell member, thereby locking the second operating link, so that the second operating link is unable to rotate relative to the shell member.

9. The clamping mechanism according to claim 6, wherein the shell member, the first operating link, the second operating link, the first clamping rod, the elastic element, the rotary rod and the second clamping rod are made of metal material or polymer material.

* * * * *